US009331079B2

(12) United States Patent
Han

(10) Patent No.: US 9,331,079 B2
(45) Date of Patent: May 3, 2016

(54) SEMICONDUCTOR DEVICE AND METHOD OF MANUFACTURING THE SAME

(71) Applicant: Semiconductor Manufacturing International (Shanghai) Corporation, Shanghai (CN)

(72) Inventor: Qiuhua Han, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/694,355

(22) Filed: Apr. 23, 2015

(65) Prior Publication Data

US 2015/0340365 A1    Nov. 26, 2015

(30) Foreign Application Priority Data

May 22, 2014    (CN) .......................... 2014 1 0220030

(51) Int. Cl.
| | |
|---|---|
| *H01L 21/8238* | (2006.01) |
| *H01L 27/092* | (2006.01) |
| *H01L 29/06* | (2006.01) |
| *H01L 29/66* | (2006.01) |
| *H01L 21/306* | (2006.01) |
| *H01L 21/3065* | (2006.01) |
| *H01L 21/265* | (2006.01) |
| *H01L 21/308* | (2006.01) |
| *H01L 21/311* | (2006.01) |
| *H01L 21/3213* | (2006.01) |
| *H01L 21/3105* | (2006.01) |
| *H01L 21/762* | (2006.01) |

(52) U.S. Cl.
CPC .......... *H01L 27/0924* (2013.01); *H01L 21/265* (2013.01); *H01L 21/308* (2013.01); *H01L 21/3065* (2013.01); *H01L 21/30604* (2013.01); *H01L 21/31055* (2013.01); *H01L 21/31111* (2013.01); *H01L 21/32134* (2013.01); *H01L 21/76224* (2013.01); *H01L 21/823821* (2013.01); *H01L 21/823878* (2013.01); *H01L 27/0922* (2013.01); *H01L 29/0653* (2013.01); *H01L 29/6681* (2013.01)

(58) Field of Classification Search
CPC ............ H01L 27/0924; H01L 21/3065; H01L 21/30604; H01L 21/265
USPC ........................................................ 438/199
See application file for complete search history.

(56) References Cited

U.S. PATENT DOCUMENTS

| | | | | |
|---|---|---|---|---|
| 8,987,791 | B2 * | 3/2015 | Huang .............. | H01L 29/66545 257/288 |
| 9,012,284 | B2 * | 4/2015 | Glass ................ | H01L 29/66545 257/24 |
| 9,153,696 | B2 * | 10/2015 | An ...................... | H01L 29/7856 |

*Primary Examiner* — Luan C Thai
(74) *Attorney, Agent, or Firm* — Innovation Counsel LLP

(57) ABSTRACT

A method of manufacturing a semiconductor device is provided. The method includes providing a semiconductor substrate, forming a plurality of fins on the semiconductor substrate, forming a plurality of shallow trench isolation (STI) structures on the semiconductor substrate on opposite sides of the fins, forming a dummy gate on the fins, forming gate spacers on opposite sides of the dummy gate, etching a first portion of the STI structures disposed outside a gate region, the first portion having a first predetermined thickness, forming an interlayer dielectric over the semiconductor substrate, removing the dummy gate, etching a second portion of the STI structures disposed in the gate region, the second portion having a second predetermined thickness, and forming a high-k dielectric layer and a metal gate in an area where the dummy gate is removed.

19 Claims, 7 Drawing Sheets

SEMICONDUCTOR DEVICE AND METHOD OF MANUFACTURING THE SAME

CROSS-REFERENCE TO RELATED APPLICATION

This application claims priority to Chinese Patent Application No. 201410220030.3 filed on May 22, 2014, the disclosure of which is incorporated herein by reference in its entirety.

BACKGROUND

1. Technical Field

The present disclosure relates to the field of semiconductor technology, and more particularly to a semiconductor device and method of manufacturing the same.

2. Description of the Related Art

In the field of semiconductor technology, as the technology process node continues to scale, fin-type field effect transistors (FinFETs) are increasingly being used in semiconductor devices due to their superior performance.

A FinFET may be formed using the following method. The method may include forming a fin, forming shallow trench isolation (STI) structures between adjacent fins, forming a gate covering the top and sidewalls of the fin, and forming gate spacers on opposite sides of the gate. A height of the fin may be measured by the portion of the fin protruding above the STI structures.

However, in some instances, the height of the fin may result in the fin having a high aspect ratio, which may subsequently lead to topographical defects when forming the gate and the gate spacers. For example, the gate may not be formed properly over the fin. Likewise, the gate spacers may not be formed properly on the opposite sides of the gate. The above topographical defects may affect the performance and yield of the semiconductor device.

SUMMARY

The present disclosure addresses at least the above issues in the prior art.

According to an embodiment of the inventive concept, a method of manufacturing a semiconductor device is provided. The method includes: providing a semiconductor substrate; forming a plurality of fins on the semiconductor substrate; forming a plurality of shallow trench isolation (STI) structures on the semiconductor substrate on opposite sides of the fins; forming a dummy gate on the fins; forming gate spacers on opposite sides of the dummy gate; etching a first portion of the STI structures disposed outside a gate region, the first portion having a first predetermined thickness; forming an interlayer dielectric over the semiconductor substrate; removing the dummy gate; etching a second portion of the STI structures disposed in the gate region, the second portion having a second predetermined thickness; and forming a high-k dielectric layer and a metal gate in an area where the dummy gate is removed.

In one embodiment, the first portion of the STI structures may be etched using an isotropic etching process.

In one embodiment, a thickness of the first portion of the STI structures may range from about 5 nm to about 20 nm.

In one embodiment, the second portion of the STI structures may be etched using a diluted hydrofluoric acid (DHF) wet etch or a dry etching process.

In one embodiment, the second portion of the STI structures may be disposed in the gate region of a p-type metal-oxide-semiconductor (PMOS) region, and the second predetermined thickness of the second portion may be configured such that a height of a first fin in the PMOS region is greater than a height of a second fin in an n-type metal-oxide-semiconductor (NMOS) region.

In one embodiment, the second portion of the STI structures may be disposed in the gate region of an n-type metal-oxide-semiconductor (NMOS) region, and the second predetermined thickness of the second portion may be configured such that a height of a first fin in the NMOS region is greater than a height of a second fin in a p-type metal-oxide-semiconductor (PMOS) region.

In one embodiment, the method may further include, after forming the interlayer dielectric and prior to removing the dummy gate: performing ion implantation on the interlayer dielectric, so as to reduce a rate at which the interlayer dielectric is etched during the removing of the dummy gate.

In one embodiment, the ion implantation may include implanting carbon ions into the interlayer dielectric, and an energy dosage of the ion implantation may range from about 10 kV to about 50 kV, and a dosage concentration of the ions may range from about $1 \times 10^{15}$ cm$^3$ to about $1 \times 10^{19}$ cm$^3$.

In one embodiment, forming the plurality of fins may further include: forming a hard mask layer on the semiconductor substrate; and etching the semiconductor substrate through the hard mask layer to form the fins.

In one embodiment, forming the STI structures may further include: depositing a dielectric material on the semiconductor substrate; removing portions of the dielectric material protruding above the fins using chemical mechanical polishing (CMP), the remaining dielectric material forming a shallow trench isolation layer; and etching back a portion of the shallow trench isolation layer to form the STI structures.

In one embodiment, forming the dummy gate and the gate spacers may further include: forming a dummy gate layer over the semiconductor substrate covering the fins; etching the dummy gate layer to form the dummy gate; forming a spacer layer over the semiconductor substrate covering the dummy gate; and etching the spacer layer to form the gate spacers on the opposites sides of the dummy gate.

In one embodiment, forming the interlayer dielectric may further include: forming an interlayer dielectric layer over the semiconductor substrate; and performing chemical mechanical polishing (CMP) on the interlayer dielectric layer so as to form the interlayer dielectric.

In one embodiment, the dummy gate may be removed by wet etching.

In one embodiment, forming the high-k dielectric layer and the metal gate may further include: depositing a high-k dielectric material over the semiconductor substrate; depositing a metal layer on the high-k dielectric material; and removing portions of the high-k dielectric material and the metal layer protruding above the gate spacers using chemical mechanical polishing (CMP), so as to form the high-k dielectric layer and the metal gate.

In one embodiment, the method may further include, after etching the first portion of the STI structures and prior to forming the interlayer dielectric: forming a source and a drain respectively on the opposite sides of the dummy gate.

In one embodiment, the first predetermined thickness may be different from the second predetermined thickness.

According to another embodiment of the inventive concept, a semiconductor device is provided. The semiconductor device includes: a semiconductor substrate; a plurality of fins on the semiconductor substrate; a plurality of shallow trench isolation (STI) structures on the semiconductor substrate on opposite sides of the fins, wherein the STI structures are disposed below a top surface of the fins; a high-k dielectric layer disposed over the semiconductor substrate covering the STI structures and the fins; and a metal gate disposed on the high-k dielectric layer.

In one embodiment, a thickness of the STI structures in a first region of the semiconductor substrate may be different from a thickness of the STI structures in a second region of the semiconductor substrate.

In one embodiment, the fins may include a first fin in the first region and a second fin in the second region, and a height of the first fin may be different from a height of the second fin, wherein the height of the first fin may be measured from a top surface of the first fin to a top surface of the STI structures in the first region, and the height of the second fin may be measured from a top surface of the second fin to a top surface of the STI structures in the second region.

In one embodiment, the first region may be one of an n-type metal-oxide-semiconductor (NMOS) region and a p-type metal-oxide-semiconductor (PMOS) region, and the second region may be the other one of the NMOS region and the PMOS region.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

FIGS. 1H' and 1I' depict schematic views of a semiconductor device at different stages of manufacture according to another embodiment.

DETAILED DESCRIPTION

Figure 1A:
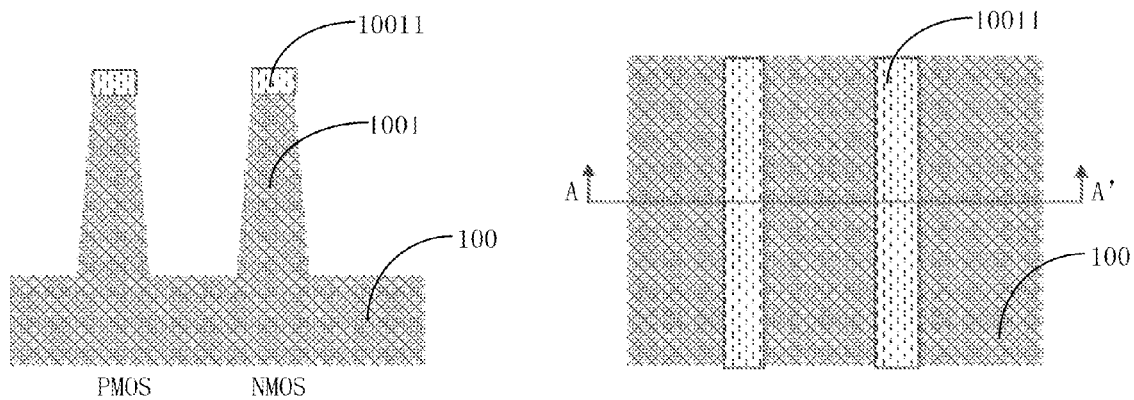
FIGS. 1A, 1B, 1C, 1D, 1E, 1F, 1G, 1H, and 1I depict schematic views of a semiconductor device at different stages of manufacture according to an embodiment.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that when an element or layer is referred to as "in", "adjacent to", "connected to", or "coupled to" another element or layer, it can be directly on the other element or layer, adjacent, connected or coupled to the other element or layer. In some instances, one or more intervening elements or layers may be present. In contrast, when an element is referred to as being "directly on", "directly adjacent to", "directly connected to", or "directly coupled to" another element or layer, there are no intervening elements present or layer. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "beneath", "below", "lower", "above", "upper" and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Exemplary embodiments are described herein with reference to cross-sectional illustrations that are schematic illustrations of idealized exemplary embodiments (and intermediate structures) of the inventive concept. As such, variations from the shapes of the illustrations as a result of, for example, manufacturing techniques and/or tolerances, are to be expected. Thus, the exemplary embodiments should not be construed as being limited to the particular shapes of regions illustrated herein, but may also include deviations in shapes that result, for example, from manufacturing tolerances. The regions illustrated in the figures are schematic in nature, and their shapes are not intended to illustrate the actual shape of a region of a device, and should not be construed to limit the scope of the inventive concept.

It should be understood that the inventive concept is not limited to the embodiments described herein. Rather, the inventive concept may be modified in different ways to realize different embodiments.

First, a method of manufacturing a semiconductor device according to an embodiment will be described in detail with reference to FIGS. 1A though 1I. Specifically, FIGS. 1A though 1I depict schematic views of the semiconductor device at different stages of manufacture. In each figure, a cross-sectional view of the semiconductor device is depicted on the left, and a plan view of the semiconductor device is depicted on the right. Specifically, the cross-sectional view in each of FIGS. 1A, 1B, 1C, 1E, 1F, 1G, 1H, and 1I is taken along line A-A' of the corresponding plan view. The cross-sectional view in FIG. 1D is taken along line B-B' of the corresponding plan view.

The semiconductor device may include one or more Fin-FETs. The method includes the following steps.

In Step A1, a semiconductor substrate 100 is provided. Fins 1001 are formed on the semiconductor substrate 100. In one embodiment, the fins 1001 are formed on a p-type metal-oxide-semiconductor (PMOS) region and an n-type metal-oxide-semiconductor (NMOS) region of the semiconductor substrate 100, as shown in FIG. 1A. The fins 1001 may be formed by etching the semiconductor substrate 100 or any other appropriate method.

In some instances, a hard mask layer 10011 may be disposed on a top portion of the fins 1001, as shown in FIG. 1A.

In one embodiment, Step A1 further includes Steps A101 and A102, described below.

In Step A101, the semiconductor substrate 100 is provided, and the hard mask layer 10011 is formed on the semiconductor substrate 100.

In Step A102, the semiconductor substrate 100 is etched through the hard mask layer 10011 so as to form the fins 1001.

The semiconductor substrate 100 may be a silicon substrate, a silicon-on-insulator (SOI) substrate, or any other appropriate substrate. The hard mask layer 10011 may be made of silicon nitride or any other appropriate etch mask material.

Figure 1B:
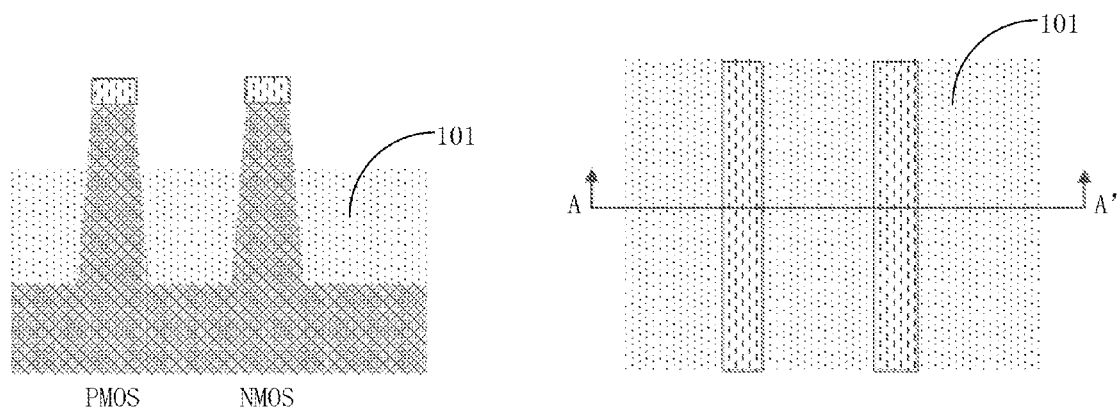

In Step A2, shallow trench isolation (STI) structures 101 are formed on the semiconductor substrate 100 on opposite sides of the fins 1001, as shown in FIG. 1B. The STI structures 101 may be made of silicon oxide or any other appropriate material.

The STI structures 101 typically have a same thickness in the different regions (e.g. the PMOS region and the NMOS region) of the semiconductor substrate 100. In other words, the upper surfaces of the STI structures 101 are generally disposed on a same plane.

In one embodiment, Step A2 further includes Steps A201 through A203, described below.

In Step A201, a dielectric material is deposited on the semiconductor substrate 100, the dielectric material covering the fins 1001 and the gaps between adjacent fins 1001. The dielectric material is typically deposited above (and covering) the hard mask layer 10011 on the fins 1001. The dielectric material may be silicon oxide or any other appropriate material.

In Step A202, the portions of the dielectric material protruding above the hard mask layer 10011 are removed using chemical mechanical polishing (CMP). The remaining dielectric material forms a shallow trench isolation layer.

In Step A203, the shallow trench isolation layer is etched back to form the STI structures 101. Specifically, a portion of the shallow trench isolation layer is removed by the etch back. The resulting structure formed after Step A203 is illustrated in FIG. 1B.

It is noted that a smaller portion of the shallow trench isolation layer is removed by the etch back in Step A203 compared to prior art teachings. When a smaller portion of the shallow trench isolation layer is etched back, a height of the fins 1001 (as measured from a top surface of the fins 1001 to a top surface of the STI structures 101) would be less compared to conventional fins. In other words, a smaller portion of the fins 1001 protrudes above the STI structures 101 compared to the conventional fins in the prior art. Accordingly, the exposed portions of the fins 1001 will have a lower aspect ratio compared to that of conventional fins. As previously mentioned in the Background section, topographical defects may arise when forming the gates and gate spacers if the fins have a high aspect ratio. Thus, the lower fin aspect ratio in FIG. 2B helps to ensure that gates and gate spacers can be properly formed on the fins 1001 during the subsequent process steps.

In one embodiment, the STI structures 101 may undergo a second etch back so that the fins 1001 are formed having a predetermined height. As previously mentioned, the height of the fins 1001 is measured from a top surface of the fins 1001 to a top surface of the STI structures 101.

Figure 1C:
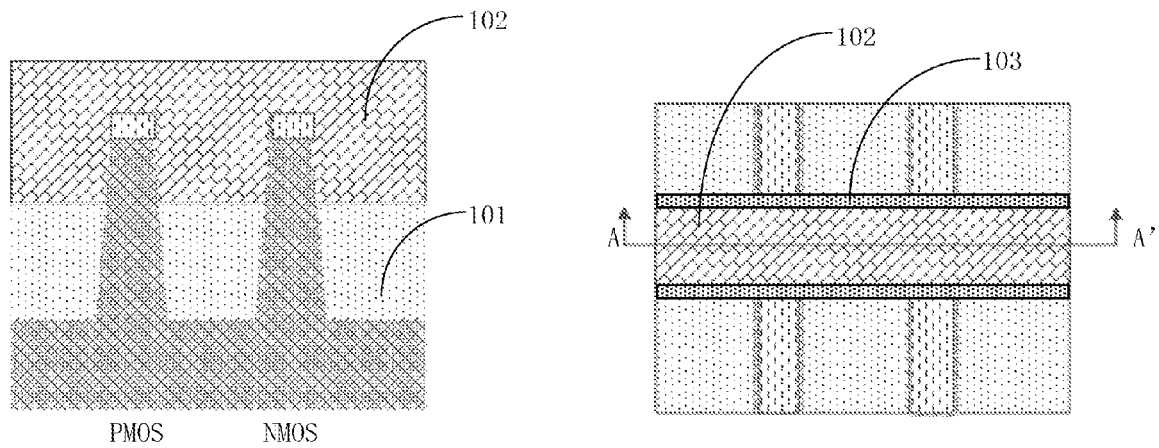
Figure 1D:
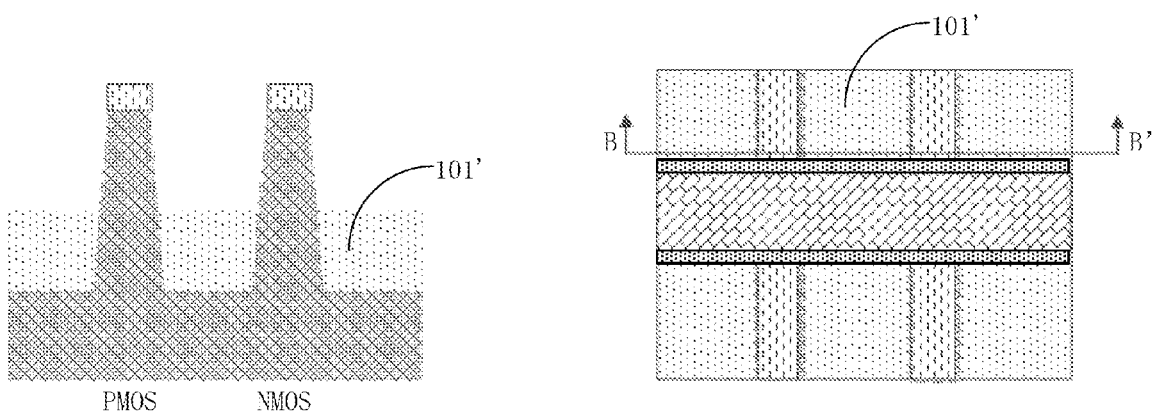

In Step A3, a dummy gate 102 is formed over the fins 1001, and gate spacers 103 are formed on opposite sides of the dummy gate 102, as shown in FIG. 1C. The dummy gate 102 may be made of polysilicon or any other appropriate material. The gate spacers 103 may be made of silicon oxide, silicon nitride, or any other appropriate material.

In one embodiment, Step A3 further includes Steps A301 through A304, described below.

In Step A301, a dummy gate layer is formed over the semiconductor substrate 100 covering the fins 1001.

In Step A302, the dummy gate layer is etched to form the dummy gate 102.

In Step A303, a spacer layer is formed over the semiconductor substrate 100 covering the dummy gate 102.

In Step A304, the spacer layer is etched to form the gate spacers 103 on opposite sides of the dummy gate 102.

The resulting structure formed after Step A304 is illustrated in FIG. 1C.

It should be noted that Step A3 may be performed using different methods, and need not be limited to the above-described embodiments.

In Step A4, a portion of the STI structures 101 disposed outside the gate region is removed by etching. The resulting structure formed after Step A4 is illustrated in FIG. 1D. Specifically, a portion of the STI structures 101 disposed on opposite sides of the dummy gate 102 is removed. The removed portion of the STI structures 101 has a predetermined thickness ranging from about 5 nm to about 20 nm. The remaining portion of the STI structures 101 is denoted by 101', as shown in FIG. 1D.

The portion of the STI structures 101 disposed outside the gate region may be removed by etching. The etching may be performed using dry etching, wet etching, or any other appropriate etching method. In one embodiment, the etching may include isotropic etching.

In one embodiment, after the portion of the STI structures 101 disposed outside the gate region has been removed, a source and a drain may be formed on the opposite sides of the dummy gate 102. The source and the drain may be formed using methods known to those skilled in the art. To avoid obscuring the inventive concept, the source and the drain have been omitted from FIG. 1D.

Figure 1E:
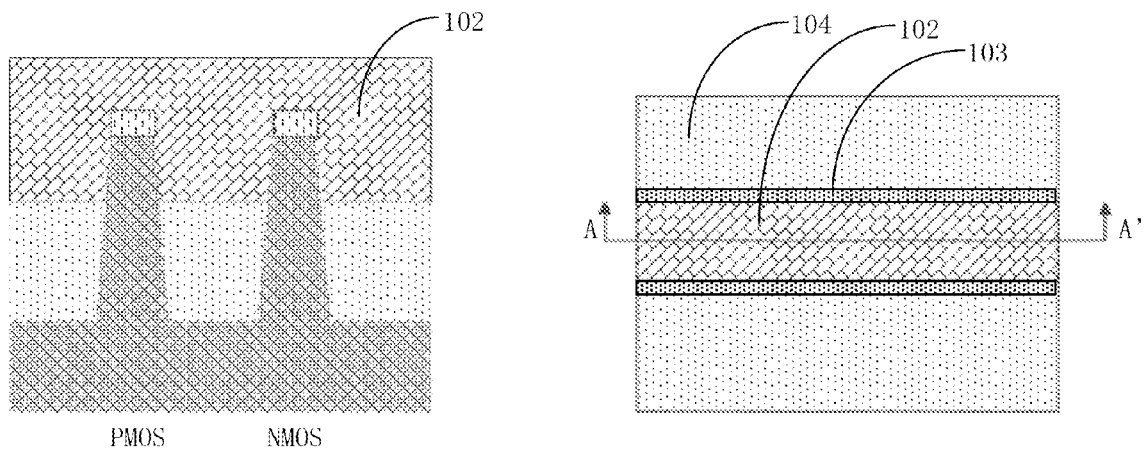
Figure 1F:
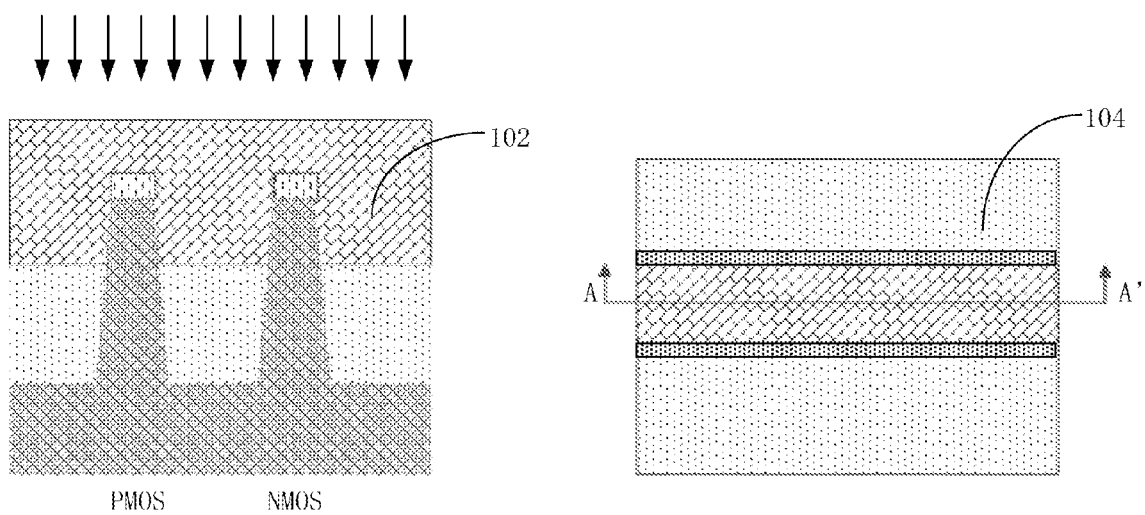

In Step A5, an interlayer dielectric 104 is formed over the semiconductor substrate 100, as shown in FIG. 1E. Specifically, the interlayer dielectric 104 is formed with the dummy gate 102 disposed therebetween. A height of the interlayer dielectric 104 may be the same as a height of the dummy gate

102. The interlayer dielectric 104 may be made of silicon oxide or any other appropriate material.

In one embodiment, Step A5 may include forming an interlayer dielectric layer over the semiconductor substrate 100 and performing CMP on the interlayer dielectric layer, so as to form the interlayer dielectric 104.

In Step A6, ion implantation is performed on the interlayer dielectric 104 to change the etch selectivity of the interlayer dielectric 104 relative to the dummy gate 102. Specifically, the ion implantation can lower the rate at which the interlayer dielectric 104 is etched during subsequent etching of the dummy gate 102. The downward pointing arrows in FIG. 1F denote the ion implantation process.

The implanted ions may include carbon ions or other ions having similar properties. The ion implantation need not be limited to the interlayer dielectric 104. For example, in one embodiment, the ion implantation may be performed concurrently on the interlayer dielectric 104, the dummy gate 102, and the gate spacers 103.

In one embodiment, the implanted ions are carbon ions, and an energy dosage of the ion implantation may range from about 10 kV to about 50 kV, and a dosage concentration of the ions may range from about $1 \times 10^{15}$ cm$^{-3}$ to about $1 \times 10^{19}$ cm$^{-3}$.

As described above, the ion implantation can lower the rate at which the interlayer dielectric 104 is etched during subsequent etching of the dummy gate 102. For example, the wet etch rate of the interlayer dielectric 104 may be reduced after the ion implantation. In particular, the etch rate of the interlayer dielectric 104 is reduced so as to minimize damage to the interlayer dielectric 104 during subsequent etching of the dummy gate 102.

In some particular instances, Step A6 may be omitted. For example, Step A6 may be omitted if the subsequent etching of the dummy gate 102 does not affect (or has little effect on) the interlayer dielectric 104.

Figure 1G:
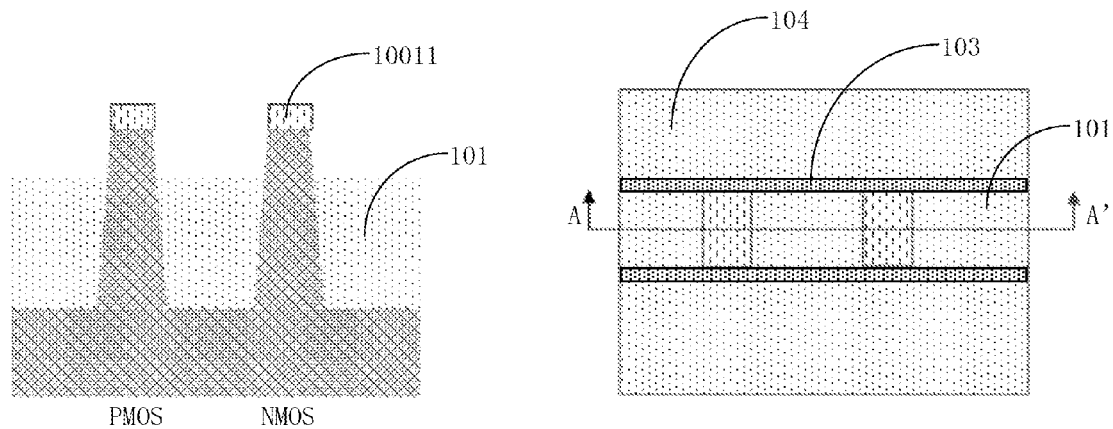

In Step A7, the dummy gate 102 is removed, as shown in FIG. 1G. The dummy gate 102 may be removed using wet etching or any other appropriate method.

As a result of the ion implantation in Step A6, the rate at which the interlayer dielectric 104 is etched during the etching of the dummy gate 102 in Step A7 can be reduced. Accordingly, damage to the interlayer dielectric 104 during the etching of the dummy gate 102 is minimized, thereby improving device yield.

In Step A8, a portion of the STI structures 101 disposed in the gate region (i.e. the channel region) is removed. The portion of the STI structures 101 may be disposed in, for example, the PMOS gate region. The removed portion of the STI structures 101 has a predetermined thickness.

Figure 1H:
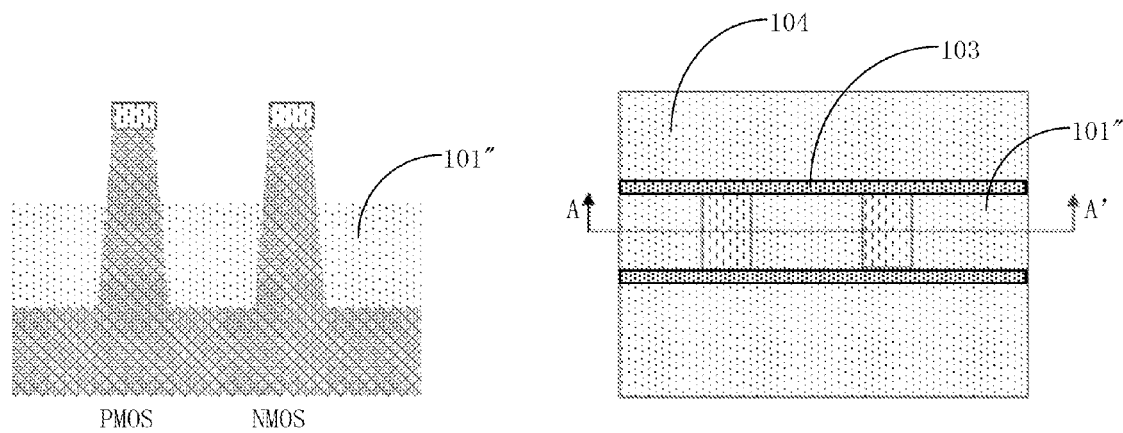
Figure 1H:
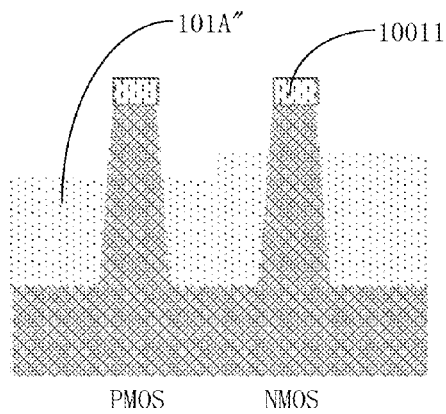
Figure 1H:
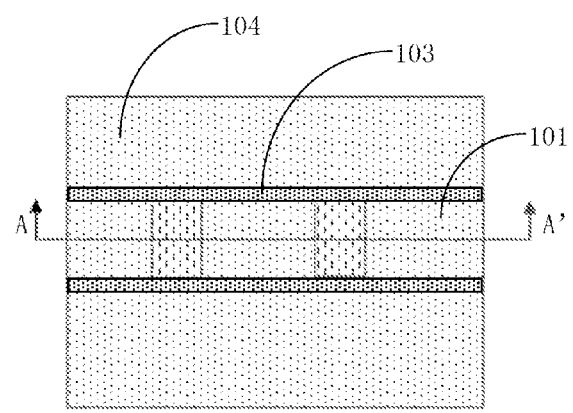

FIG. 1H illustrates the resulting structure formed after Step A8. The remaining portion of the STI structures 101 is denoted by 101", as shown in FIG. 1H.

In some embodiments, the portion of the STI structures 101 disposed in the gate region may be selectively etched. For example, in one embodiment, only the portion of the STI structures 101 disposed in the PMOS gate region is etched. In another embodiment, only the portion of the STI structures 101 disposed in the NMOS gate region is etched. As such, in the above embodiments, the fins 1001 are formed having different heights in different regions (e.g. the PMOS region and the NMOS region). Accordingly, fins of different heights can be formed on a same semiconductor device.

In one embodiment, a portion of the STI structures 101 disposed in the PMOS gate region is removed. The removed portion of the STI structures 101 has a predetermined thickness such that a height of the fins 1001 in the PMOS region is greater than a height of the fins 1001 in the NMOS region.

The portion of the STI structures 101 disposed in the gate region may be removed by etching. The etching may include dry etching, wet etching, or any other appropriate etching method. For example, in one embodiment, the etching may include wet etching using diluted hydrofluoric acid (DHF). The DHF may be diluted 50:1 to 1000:1. In another embodiment, the etching may include dry etching using, for example, a SiConi™ etch. A SiConi™ etch is a remote plasma assisted dry etch process which involves the simultaneous exposure of a substrate to $H_2$, $NF_3$ and $NH_3$ plasma by-products.

As previously described, a portion of the STI structures 101 disposed in the gate region is removed. The removed portion of the STI structures 101 has a predetermined thickness. Accordingly, the height of the fins 1001 can be adjusted by changing the predetermined thickness of the removed portion of the STI structures 101.

Figure 1I:
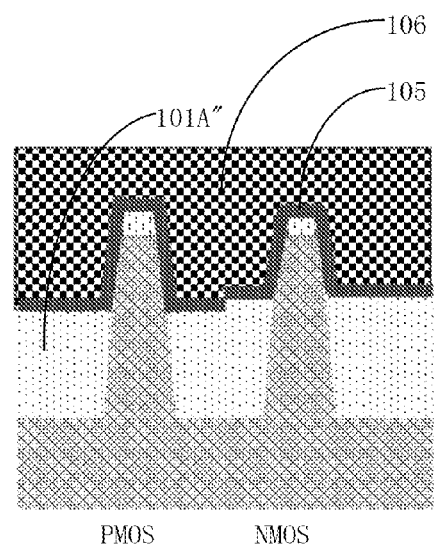
Figure 1I:
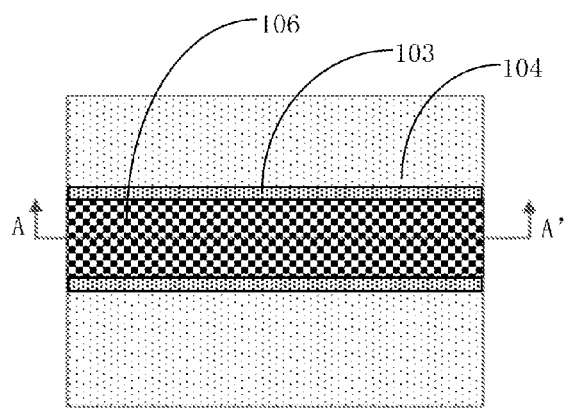
Figure 1I:
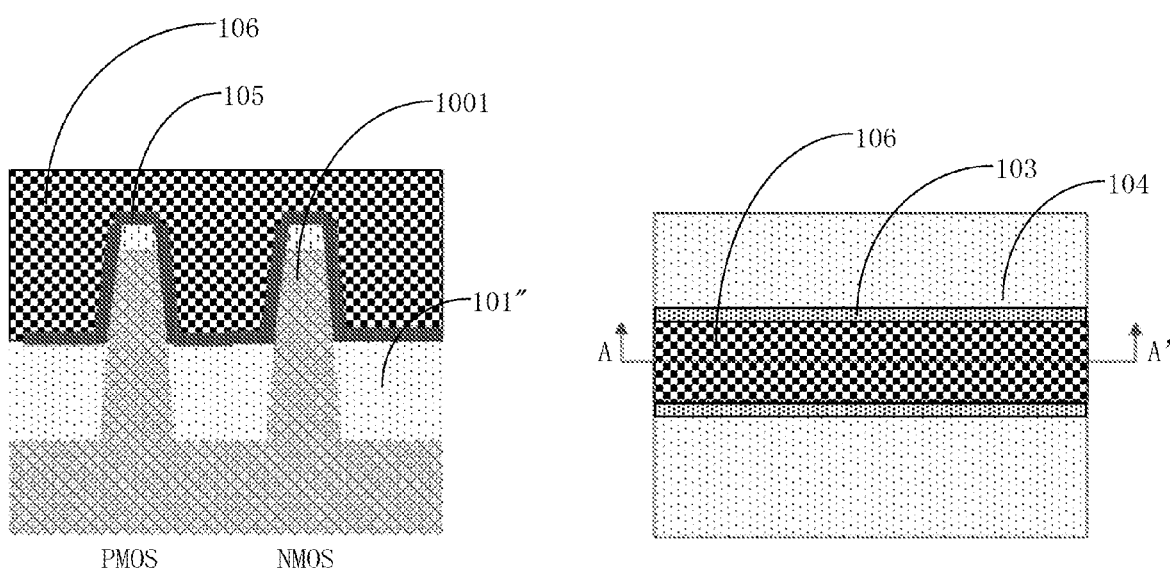

In Step A9, a high-k dielectric layer 105 is formed in the gate region and a metal gate 106 is formed on the high-k dielectric layer 105, as shown in FIG. 1I. The high-k dielectric layer 105 and the metal gate 106 may be made of materials known to those skilled in the art.

In one embodiment, Step A9 further includes Steps A901 and A902, described below.

In Step A901, a high-k dielectric material is deposited over the semiconductor substrate and a metal layer is deposited on the high-k dielectric material.

In Step A902, the portions of the high-k dielectric material and the metal layer protruding above the gate spacers 103 are removed by CMP, so as to form the high-k dielectric layer 105 and the metal gate 106.

In some embodiments, Steps A8 and A9 may be further modified to form the structures illustrated in FIGS. 1H' and 1I'. Specifically, FIGS. 1H' and 1I' depict schematic views of a semiconductor device at different stages of manufacture according to another embodiment. The modified Steps A8 and A9 are denoted by Steps A8' and A9', respectively.

In Step A8', a portion of the STI structures 101 disposed in the PMOS gate region is removed. The removed portion of the STI structures 101 has a predetermined thickness such that a height of the fins 1001 in the PMOS region is greater than a height of the fins 1001 in the NMOS region, as shown in FIG. 1H'.

FIG. 1H' illustrates the resulting structure formed after Step A8'. The remaining portion of the STI structures 101 is denoted by 101A", as shown in FIG. 1H'. Accordingly, in the example of FIG. 1H', fins of different heights can be formed on a same semiconductor device.

In Step A9', a high-k dielectric layer 105 is formed in the gate region and a metal gate 106 is formed on the high-k dielectric layer 105, as shown in FIG. 1I'. The high-k dielectric layer 105 and the metal gate 106 may be formed using materials known to those skilled in the art, but need not be limited thereto. As shown in FIG. 1I', the metal gate 106 may have different thicknesses in the PMOS region and the NMOS region because the underlying STI structures 101A" have different thicknesses in the PMOS region and the NMOS region.

It is noted that Step A9' may further include Steps A901 and A902 which have been previously described.

In the exemplary method of manufacturing the semiconductor device, prior to forming the dummy gate and gate spacers, a height of the fins can be controlled by controlling a thickness of the STI structures, so as to ensure good topography in the subsequently formed dummy gate and gate spacers. After forming the dummy gate and gate spacers but prior to forming the metal gate, a portion of the STI structures having a predetermined thickness in the channel region (gate region) is removed to ensure that the fins meet a target height, so as to ensure good topography in the subsequently formed metal gate. Accordingly, the semiconductor device manufactured using the exemplary method has improved device performance and reliability compared to those in the prior art.

Figure 2:
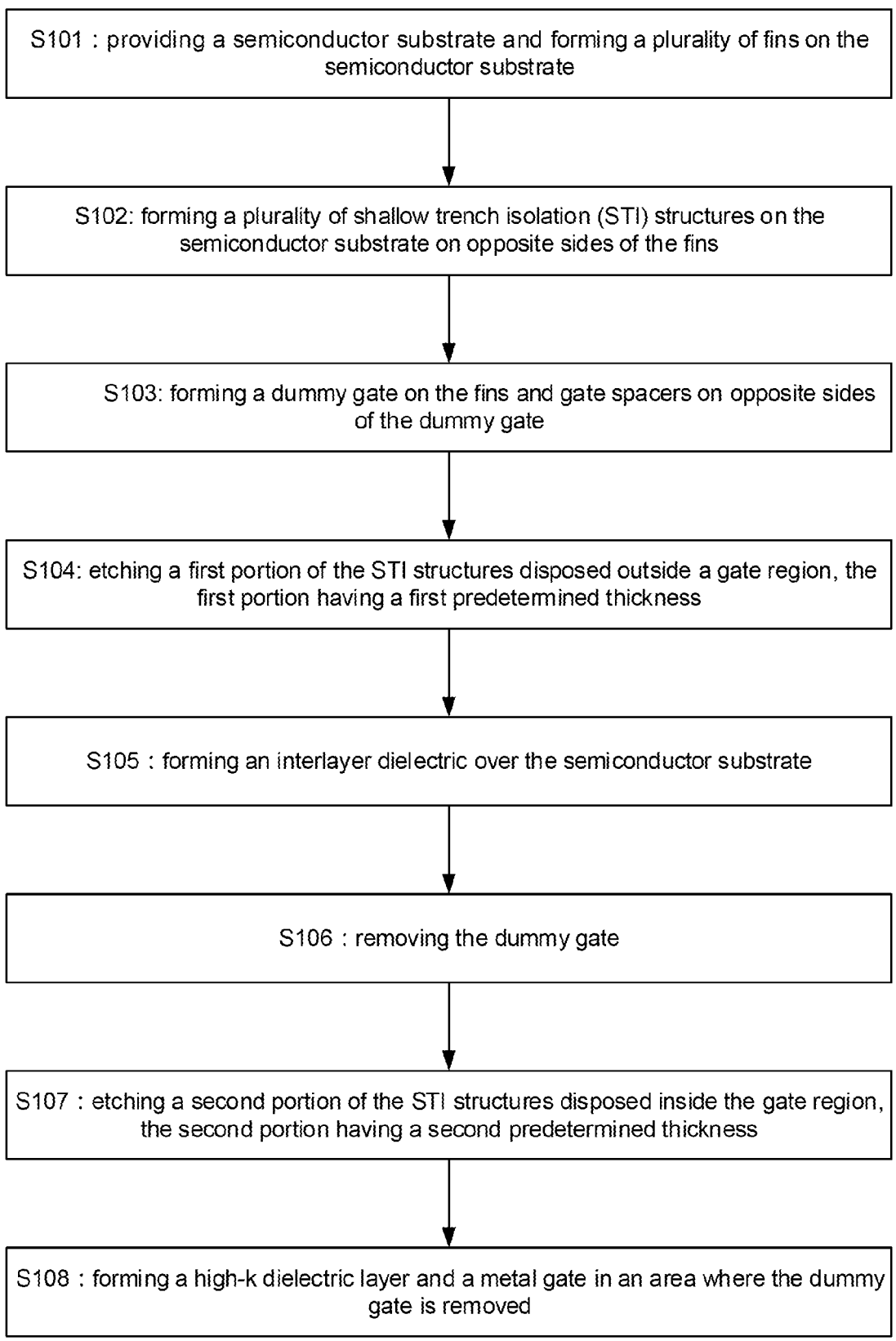
FIG. 2 is a flowchart illustrating a method of manufacturing a semiconductor device according to an embodiment.

FIG. 2 is a flowchart illustrating a method of manufacturing a semiconductor device according to an embodiment. The method of FIG. 2 may include some or all of the previously-described Steps A1 through A9 (and/or Steps A8' and A9') including their sub-steps. Specifically, the method of FIG. 2 includes the following steps.

Step S101: providing a semiconductor substrate and forming a plurality of fins on the semiconductor substrate.

Step S102: forming a plurality of shallow trench isolation (STI) structures on the semiconductor substrate on opposite sides of the fins.

Step S103: forming a dummy gate on the fins and gate spacers on opposite sides of the dummy gate.

Step S104: etching a first portion of the STI structures disposed outside a gate region, the first portion having a first predetermined thickness.

Step S105: forming an interlayer dielectric over the semiconductor substrate.

Step S106: removing the dummy gate.

Step S107: etching a second portion of the STI structures disposed in the gate region, the second portion having a second predetermined thickness.

Step S108: forming a high-k dielectric layer and a metal gate in an area where the dummy gate is removed.

A semiconductor device manufactured using the method of FIG. 2 may be incorporated into an electronic apparatus. As previously mentioned, the exemplary semiconductor device has improved performance and reliability compared to existing devices. Therefore, the electronic apparatus including the exemplary semiconductor device would inherit the above desirable characteristics. The exemplary semiconductor device can be formed on an integrated circuit that is then incorporated into the electronic apparatus. The electronic apparatus may include mobile phones, tablet PCs, laptops, netbooks, game consoles, TVs, VCD players, DVD players, navigation systems, cameras, video cameras, voice recorders, MP3/MP4 players, PSPs, and any other electronic products or devices. The electronic apparatus may also include intermediate (unfinished) products comprising the exemplary semiconductor device.

Embodiments of a semiconductor device and a method of manufacturing the semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

Different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A method of manufacturing a semiconductor device, comprising:
   providing a semiconductor substrate;
   forming a plurality of fins on the semiconductor substrate;
   forming a plurality of shallow trench isolation (STI) structures on the semiconductor substrate on opposite sides of the fins;
   forming a dummy gate on the fins;
   forming gate spacers on opposite sides of the dummy gate;
   etching a first portion of the STI structures disposed outside a gate region, the first portion having a first predetermined thickness;
   forming an interlayer dielectric over the semiconductor substrate;
   removing the dummy gate;
   etching a second portion of the STI structures disposed in the gate region, the second portion having a second predetermined thickness; and
   forming a high-k dielectric layer and a metal gate in an area where the dummy gate is removed.

2. The method according to claim 1, wherein the first portion of the STI structures is etched using an isotropic etching process.

3. The method according to claim 1, wherein a thickness of the first portion of the STI structures ranges from about 5 nm to about 20 nm.

4. The method according to claim 1, wherein the second portion of the STI structures is etched using a diluted hydrofluoric acid (DHF) wet etch or a dry etching process.

5. The method according to claim 1, wherein the second portion of the STI structures is disposed in the gate region of a p-type metal-oxide-semiconductor (PMOS) region, and
   wherein the second predetermined thickness of the second portion is configured such that a height of a first fin in the PMOS region is greater than a height of a second fin in an n-type metal-oxide-semiconductor (NMOS) region.

6. The method according to claim 1, wherein the second portion of the STI structures is disposed in the gate region of an n-type metal-oxide-semiconductor (NMOS) region, and
   wherein the second predetermined thickness of the second portion is configured such that a height of a first fin in the NMOS region is greater than a height of a second fin in a p-type metal-oxide-semiconductor (PMOS) region.

7. The method according to claim 1, wherein after forming the interlayer dielectric and prior to removing the dummy gate, the method further comprising:
   performing ion implantation on the interlayer dielectric, so as to reduce a rate at which the interlayer dielectric is etched during the removing of the dummy gate.

8. The method according to claim 7, wherein the ion implantation includes implanting carbon ions into the interlayer dielectric, and
   wherein an energy dosage of the ion implantation ranges from about 10 kV to about 50 kV, and a dosage concentration of the ions ranges from about $1 \times 10^{15}$ cm$^{-3}$ to about $1 \times 10^{19}$ cm$^{-3}$.

9. The method according to claim 1, wherein forming the plurality of fins further comprises:
   forming a hard mask layer on the semiconductor substrate; and
   etching the semiconductor substrate through the hard mask layer to form the fins.

10. The method according to claim 1, wherein forming the STI structures further comprises:
    depositing a dielectric material on the semiconductor substrate;
    removing portions of the dielectric material protruding above the fins using chemical mechanical polishing (CMP), the remaining dielectric material forming a shallow trench isolation layer; and
    etching back a portion of the shallow trench isolation layer to form the STI structures.

11. The method according to claim 1, wherein forming the dummy gate and the gate spacers further comprises:
    forming a dummy gate layer over the semiconductor substrate covering the fins;

etching the dummy gate layer to form the dummy gate;

forming a spacer layer over the semiconductor substrate covering the dummy gate; and etching the spacer layer to form the gate spacers on the opposites sides of the dummy gate.

12. The method according to claim 1, wherein forming the interlayer dielectric further comprises:

forming an interlayer dielectric layer over the semiconductor substrate; and performing chemical mechanical polishing (CMP) on the interlayer dielectric layer so as to form the interlayer dielectric.

13. The method according to claim 1, wherein the dummy gate is removed by wet etching.

14. The method according to claim 1, wherein forming the high-k dielectric layer and the metal gate further comprises:

depositing a high-k dielectric material over the semiconductor substrate;

depositing a metal layer on the high-k dielectric material; and removing portions of the high-k dielectric material and the metal layer protruding above the gate spacers using chemical mechanical polishing (CMP), so as to form the high-k dielectric layer and the metal gate.

15. The method according to claim 1, wherein after etching the first portion of the STI structures and prior to forming the interlayer dielectric, the method further comprising:

forming a source and a drain respectively on the opposite sides of the dummy gate.

16. The method according to claim 1, wherein the first predetermined thickness is different from the second predetermined thickness.

17. A semiconductor device comprising:

a semiconductor substrate;

a plurality of fins on the semiconductor substrate;

a plurality of shallow trench isolation (STI) structures on the semiconductor substrate on opposite sides of the fins, wherein the STI structures are disposed below a top surface of the fins;

a high-k dielectric layer disposed over the semiconductor substrate covering the STI structures and the fins; and a metal gate disposed on the high-k dielectric layer, wherein a thickness of the STI structures in a first region of the semiconductor substrate is different from a thickness of the STI structures in a second region of the semiconductor substrate.

18. The semiconductor device according to claim 17, wherein the fins include a first fin in the first region and a second fin in the second region, and a height of the first fin is different from a height of the second fin, wherein the height of the first fin is measured from a top surface of the first fin to a top surface of the STI structures in the first region, and the height of the second fin is measured from a top surface of the second fin to a top surface of the STI structures in the second region.

19. The semiconductor device according to claim 17, wherein the first region is one of an n-type metal-oxide-semiconductor (NMOS) region and a p-type metal-oxide-semiconductor (PMOS) region, and the second region is the other one of the NMOS region and the PMOS region.

* * * * *